(12) United States Patent
Lu et al.

(10) Patent No.: US 10,811,842 B2
(45) Date of Patent: Oct. 20, 2020

(54) DISTRIBUTED FEEDBACK LASER BASED ON SURFACE GRATING

(71) Applicants: Huazhong University of Science and Technology, Wuhan (CN); Weihua Guo, Wuhan (CN)

(72) Inventors: Qiaoyin Lu, Wuhan (CN); Pengfei Zhang, Wuhan (CN); Weihua Guo, Wuhan (CN)

(73) Assignees: HUAZHONG UNIVERSITY OF SCIENCE AND TECHNOLOGY, Wuhan (CN); Weihua Guo, Wuhan (CN)

( * ) Notice: Subject to any disclaimer, the term of this patent is extended or adjusted under 35 U.S.C. 154(b) by 0 days.

(21) Appl. No.: 16/448,000

(22) Filed: Jun. 21, 2019

(65) Prior Publication Data

US 2019/0319426 A1 Oct. 17, 2019

Related U.S. Application Data

(63) Continuation-in-part of application No. PCT/CN2017/114175, filed on Dec. 1, 2017.

(30) Foreign Application Priority Data

Dec. 22, 2016 (CN) .......................... 2016 1 1200634

(51) Int. Cl.
*H01S 5/125* (2006.01)
*H01S 5/042* (2006.01)
(Continued)

(52) U.S. Cl.
CPC ............ *H01S 5/125* (2013.01); *H01S 5/0425* (2013.01); *H01S 5/1206* (2013.01);
(Continued)

(58) Field of Classification Search
CPC .... H01S 5/125; H01S 5/0425; H01S 5/04256; H01S 5/1206; H01S 5/2226;
(Continued)

(56) References Cited

U.S. PATENT DOCUMENTS

| 2005/0180479 | A1* | 8/2005 | Coleman | H01S 5/06256 372/50.11 |
| 2008/0199131 | A1* | 8/2008 | Matsuda | G02B 6/124 385/37 |
| 2017/0031097 | A1* | 2/2017 | Asai | G02B 6/132 |

* cited by examiner

*Primary Examiner* — Armando Rodriguez
(74) *Attorney, Agent, or Firm* — Matthias Scholl P.C.; Matthias Scholl

(57) ABSTRACT

A distributed feedback laser, including: a ridge waveguide; two upper electrodes disposed on two sides of the ridge waveguide, respectively; two lower electrodes disposed on two sides of the upper electrodes, respectively; a substrate; a second waveguide cladding layer; an active layer; and a first waveguide cladding layer. The first waveguide cladding layer is n-doped and includes a conductive layer and a refractive layer disposed on the conductive layer. The refractive index of the refractive layer is greater than the refractive index of the active layer. The ridge waveguide includes a ridge region formed by a middle part of the refractive layer. The ridge region includes a surface provided with Bragg gratings. Two grooves are formed between the ridge waveguide and the upper electrodes. The conductive layer is connected to the upper electrodes. The second waveguide cladding layer includes one or more current restricted areas.

10 Claims, 8 Drawing Sheets

(51) Int. Cl.
*H01S 5/12* (2006.01)
*H01S 5/22* (2006.01)
*H01S 5/30* (2006.01)
*H01S 5/32* (2006.01)

(52) U.S. Cl.
CPC .......... *H01S 5/2226* (2013.01); *H01S 5/3095* (2013.01); *H01S 5/3211* (2013.01)

(58) Field of Classification Search
CPC .. H01S 5/3095; H01S 5/3211; H01S 5/04257; H01S 5/1028
See application file for complete search history.

DISTRIBUTED FEEDBACK LASER BASED ON SURFACE GRATING

CROSS-REFERENCE TO RELATED APPLICATIONS

This application is a continuation-in-part of International Patent Application No. PCT/CN2017/114175 with an international filing date of Dec. 1, 2017, designating the United States, now pending, and further claims foreign priority benefits to Chinese Patent Application No. 201611200634.7 filed Dec. 22, 2016. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND

The invention relates to distributed feedback Bragg lasers, specifically, to distributed feedback Bragg lasers based on surface gratings.

A distributed feedback laser (DFB) is a type of laser diode, quantum cascade laser or optical fiber laser, where the active region of the device contains a periodically-structured element or diffraction grating. The structure builds a one-dimensional interference grating (Bragg scattering) and the grating provides optical feedback for the laser.

Conventional commercial DFB lasers use buried first-order Bragg gratings to provide feedback. The Bragg gratings are usually etched in the waveguide cladding layer and buried through the crystal re-growth. The re-growth process complicates the fabrication of the lasers; the yield is low, and the costs are relatively high.

The distributed feedback lasers with surface gratings involve no crystal re-growth but have relatively small coupling coefficient and large optical loss.

SUMMARY

The invention provides a DFB laser based on surface gratings.

The DFB laser comprises a ridge waveguide, the upper electrode and lower electrode regions on the both sides of the ridge waveguide, and the cross section of the laser includes a substrate, the second cladding layer, the active layer, and the first cladding layer from bottom to top.

The first cladding layer is n-doped and comprises a conductive layer and a refractive layer disposed on the conductive layer; the refractive index of the refractive layer is greater than that of the active layer; the refractive layer has a thickness of less than 1 micrometer; the intermediate region of the refractive layer forms the region of the ridge waveguide, the Bragg grating is etched on the surface of the ridge.

To reduce the optical loss and simplify the fabrication of the electrodes, no electrode is formed on the surface of the ridge waveguide; the upper electrodes are located on both sides of the ridge waveguide; two grooves are etched between the ridge waveguide and the upper electrodes; the conductive layer is connected to the upper electrodes.

The second cladding layer comprises one or more current limiting regions, or a buried tunnel junction can be formed in the first cladding layer to confine current. Thus, the mode of the ridge waveguide has a large optical confinement factor in the ridge region; the effect of the grating can be strong; and thus the grating has a large coupling coefficient. Therefore, the obtained laser has a low threshold and can be directly modulated at high-speed when the cavity length L of the laser is short.

The optical field of the ridge region has a strong interaction with the Bragg gratings, and thus the coupling coefficient of the Bragg gratings can be greater than 250 cm$^{-1}$.

The Bragg gratings can be first-order gratings comprising one or more phase shift regions of $\lambda_B/4$, or can be high-order gratings; the period of the Bragg gratings is $\Lambda = m\lambda_B/2n_{\textit{eff}}$, where $\lambda_B$ and m are a Bragg wavelength and an order of the gratings, respectively, and $n_{\textit{eff}}$ is an effective refractive index of the waveguide.

The coupling coefficient of the grating can be determined by the etching depth of the grating, the refractive index and the thickness of the ridge region, and can be 1000 cm$^{-1}$ or more.

The conductive layer can be n-doped.

The two grooves can extend to the conductive layer, and the width of the two grooves is greater than 500 nanometers so that the upper electrodes pose no effect on the mode of the ridge waveguide.

The upper electrode is an N-type electrode, and electrons are injected into the active layer region below the ridge waveguide after lateral movement of the conductive layer. The lower electrodes are a P-type electrode.

The active layer is not doped, and comprises an active layer and one or more confinement layers; the active layer consists of multi-quantum wells, quantum dots, quantum wires or a bulk material.

The second cladding layer is p-doped; the second cladding layer comprises a heavily p-doped ohmic contact layer; the first cladding layer, the active layer and the second cladding layer form an N-i-P structure; the current confinement region is formed at a position close to the active layer region in the P-type doped second waveguide layer to limit hole injection.

The method to form the current limiting region comprises: implanting ions into a corresponding region; or pre-burying an aluminum-rich layer in a corresponding region, and then oxidizing the aluminum-rich component layer to form a high resistance region; or a tunnel junction on the active layer to restrict the hole injection.

The advantages of the DFB laser based on surface gratings are as follows: the mode of the ridge waveguide has a large optical confinement factor in the ridge region, which has a strong interaction with the grating; the grating has a large coupling coefficient; a low threshold and a high-speed direct modulation can be obtained with a short laser cavity length; no electrodes are formed on the surface of the ridge waveguide, and the upper electrodes are located on both sides of the ridge waveguide, which reduces the loss and removes the difficulty in manufacturing the upper electrodes; the invention does not require regrowth, and the manufacturing process is easy to operate, thereby reducing the manufacturing cost and improving the reliability.

DETAILED DESCRIPTION

To further illustrate, examples detailing a distributed feedback laser (DFB) are described below. It should be noted that the following examples are intended to describe and not to limit the description.

Figure 1:
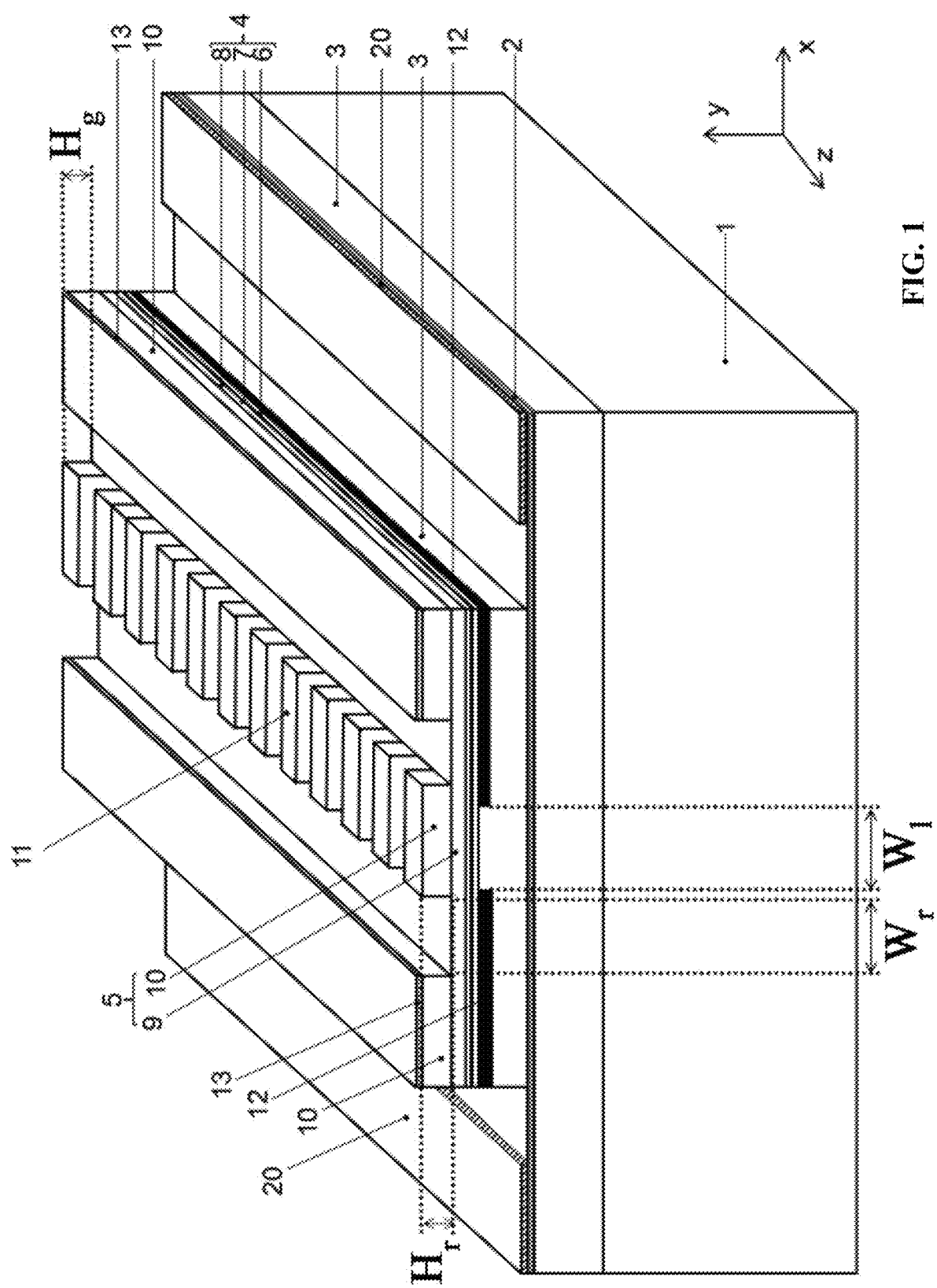
FIG. 1 is a schematic diagram of a laser as described in the disclosure.

FIG. 1 is a schematic diagram showing a DFB laser comprising a surface grating. The vertical, lateral, and longitudinal directions of the laser are labeled as x, y, and z, respectively, and the schematic diagrams in the disclosure used the same spatial coordinate system and markers. As shown in FIG. 1, the semiconductor laser comprises a substrate 1, a second cladding layer 3, an active layer 4, and a first cladding layer 5 which are sequentially arranged from the bottom up. The second cladding layer 3 is p-doped, the active layer 4 is not doped, and the first cladding layer 5 is n-doped. The first cladding layer 5, the active layer 4 and the second cladding layer 3 together form an N-i-P structure; the second cladding layer 3 comprises an ohmic contact layer 2, which is heavily p-doped and has a doping density ranging from $10^{19}$ to $10^{20}$ cm$^{-3}$ to provide sufficient carriers. The second cladding layer 3 comprises one or more current limited regions 12, or a buried tunnel junction is formed in the first cladding layer 5 for restricting current. The active layer 4 is configured to provide optical gain, and comprises one or more quantum wells 7, one or more lower confinement layers 6 and upper confinement layers 8. The quantum wells 7 can also be replaced by bulk materials, quantum wires, and quantum dots. The first cladding layer 5 comprises a conductive layer 9 and a refractive layer 10 on the conductive layer.

The refractive layer 10 is of a high refractive index material having a thickness of less than 1 micrometer as shown in FIG. 1. The Bragg grating 11 is etched on the surface of the ridge waveguide. The mode of the ridge waveguide has a relatively large optical confinement factor in the ridge. The optical field of the ridge region has a strong interaction with the grating on the ridge surface. The grating thus has a large coupling coefficient and the coupling coefficient can be greater than 250 cm$^{-1}$, so that the obtained laser has a low threshold and can be directly modulated at high-speed when the cavity length L of the laser is short.

The first-order Bragg grating is employed as the grating 11 on the surface of the ridge waveguide, and the first-order Bragg grating comprises one or more phase shift regions of $\lambda_B/4$; or a high-order grating is employed; the period of the Bragg grating is $\wedge = m\lambda_B/2n_{eff}$, where $\lambda_B$ and m are a Bragg wavelength and an order of the gratings, respectively, and $n_{eff}$ is an effective refractive index of the waveguide.

The surface of the ridge waveguide has no electrodes, and the upper electrodes 13 (N electrodes) are located on both sides of the ridge waveguide. Two lower electrodes 20 are disposed on two sides of the upper electrodes, respectively, and connected to the ohmic contact layer. Two grooves are etched between the ridge waveguide and the upper electrodes 13, and the grooves are etched to the conductive layer 9. The width W, of the grooves is greater than 500 nanometers such that the electrode is remote from the core region of the ridge waveguide and thus avoiding the influence on the mode of the ridge waveguide. The conductive layer 9 under the refractive layer 10 is connected to the upper electrodes 13. On both sides of the ridge waveguide, a high resistance region 12 is formed in the P-type doped second waveguide layer 3 near the region of the active layer 4 to limit the injection of holes. The holes can be injected only from directly under the ridge waveguide into the active layer region, so that the hole injection region and the mode of the ridge waveguide can be maximally overlapped, thereby improving the injection efficiency of the DFB laser. The confinement region of the laser for holes injection can be formed by implanting ions into a corresponding region. It is also possible to form a high resistance region by pre-burying the aluminum-rich layer such as AlAs layer in the corresponding region, and then oxidizing the aluminum-rich layer from two sides to form aluminum oxide. Alternatively, a tunnel junction can be disposed above the active layer to limit holes injection. The specific operation is as follows: a light p-doped layer is introduced between a high-conductivity layer having an n-doping and an active layer, and a tunnel junction is introduced under the ridge waveguide. Under such circumstances, the second cladding layer can be n-doped, and the structure become N-N$^{++}$-P$^{++}$-i-N in the tunnel junction region, where N$^{++}$-P$^{++}$ is a tunnel junction. The area outside the tunnel junction is an N-P-i-N structure. When the upper N electrode is applied with a positive bias voltage, the area outside the tunnel junction cannot be injected with current due to the reverse biased NP junction. At the location of the tunnel junction, the electrons can pass through the tunnel junction from the P$^{++}$ layer into the N$^{++}$ layer via quantum tunneling so that holes can be injected into the active layer below the tunnel junction.

Figure 2A:
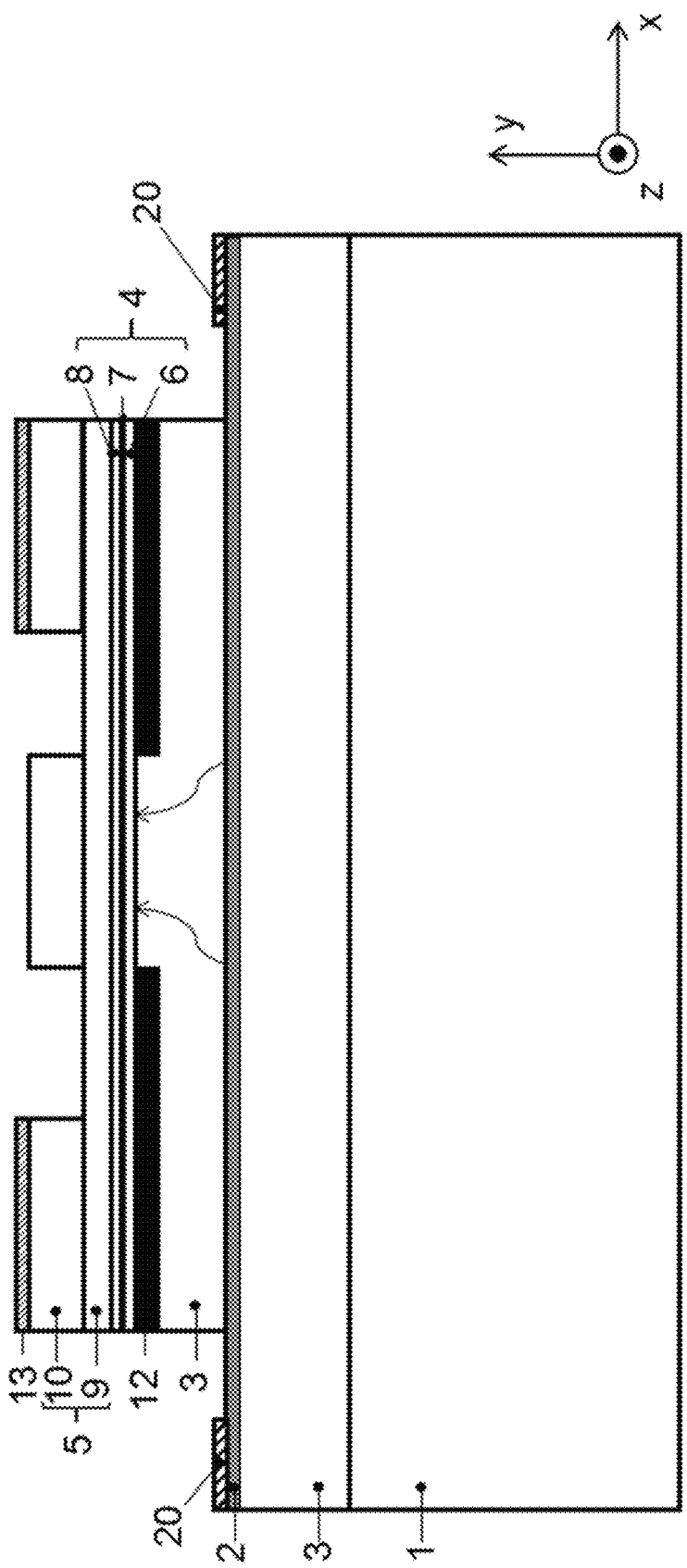
FIG. 2A is a cross-sectional view of a laser comprising an aluminum-rich current restricted layer as described in the disclosure.
Figure 2B:
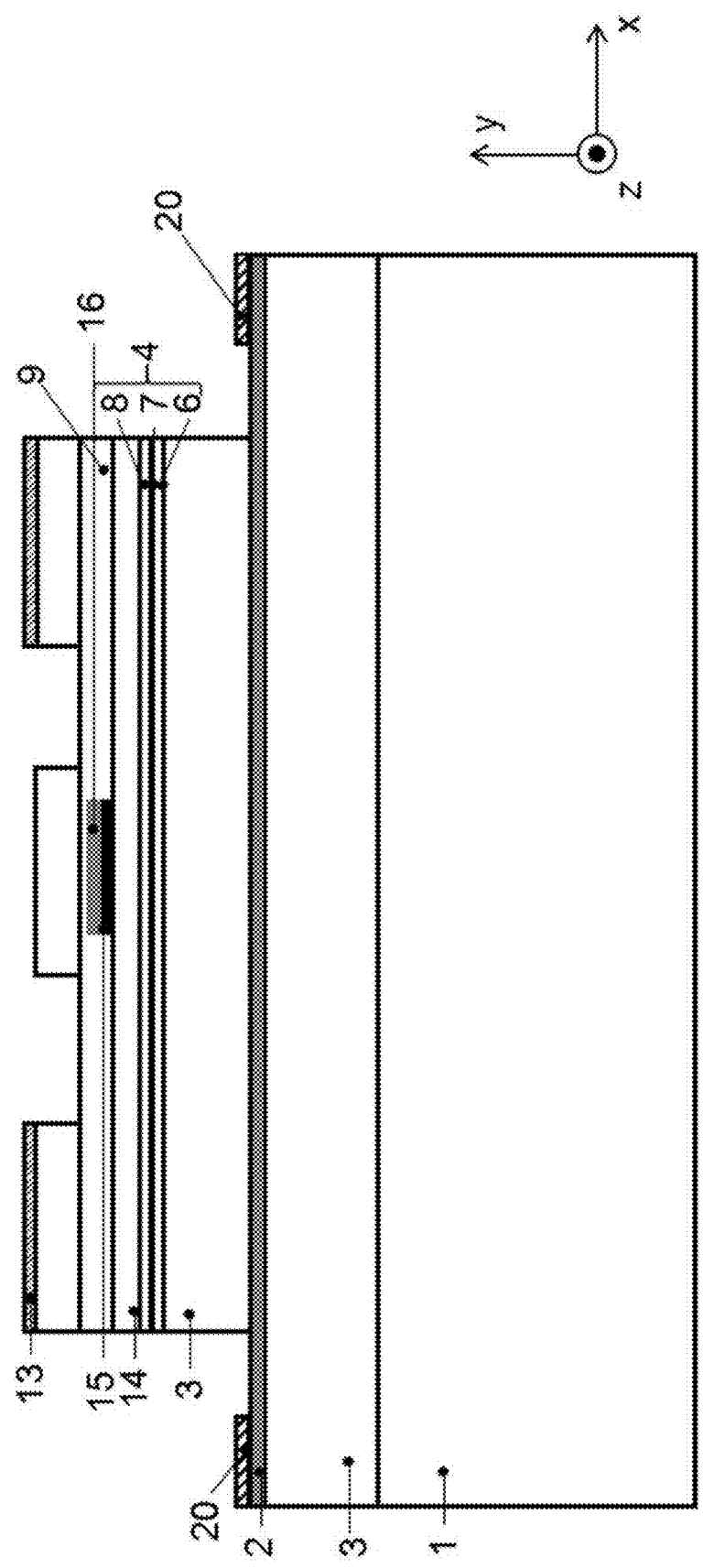
FIG. 2B is a cross-sectional view of a laser comprising a tunnel junction as described in the disclosure.

FIGS. 2A-2B show the cross-sectional structure (xy plane) of the laser under two methods of a buried tunnel junction and an aluminum-rich layer. As shown in FIG. 2A, in the laser, the second cladding layer adjacent to the active layer 4 comprises an aluminum-rich current confinement layer 12 (the material of the layer contains an aluminum-rich component and can be oxidized to (AlGa)$_x$O$_y$, which has an insulating effect, generally contains 80% or more of the aluminum component), and the selective region is oxidized to form a high resistance region. As shown in FIG. 2B, in the laser, a buried tunnel junction is formed in the first cladding layer 5 adjacent to the active layer 4. The tunnel junction comprises a heavily p-doped layer 15, that is, a P$^{++}$ layer, and a heavily n-doped layer, that is, an N$^{++}$ layer 16. A lightly p-doped layer 14 is introduced between the n-doped conductive layer 9 and the active layer 4, and the second cladding layer 3 can be n-doped. After the current is injected, the buried tunnel junction structure can help to limit the current.

Figure 3:
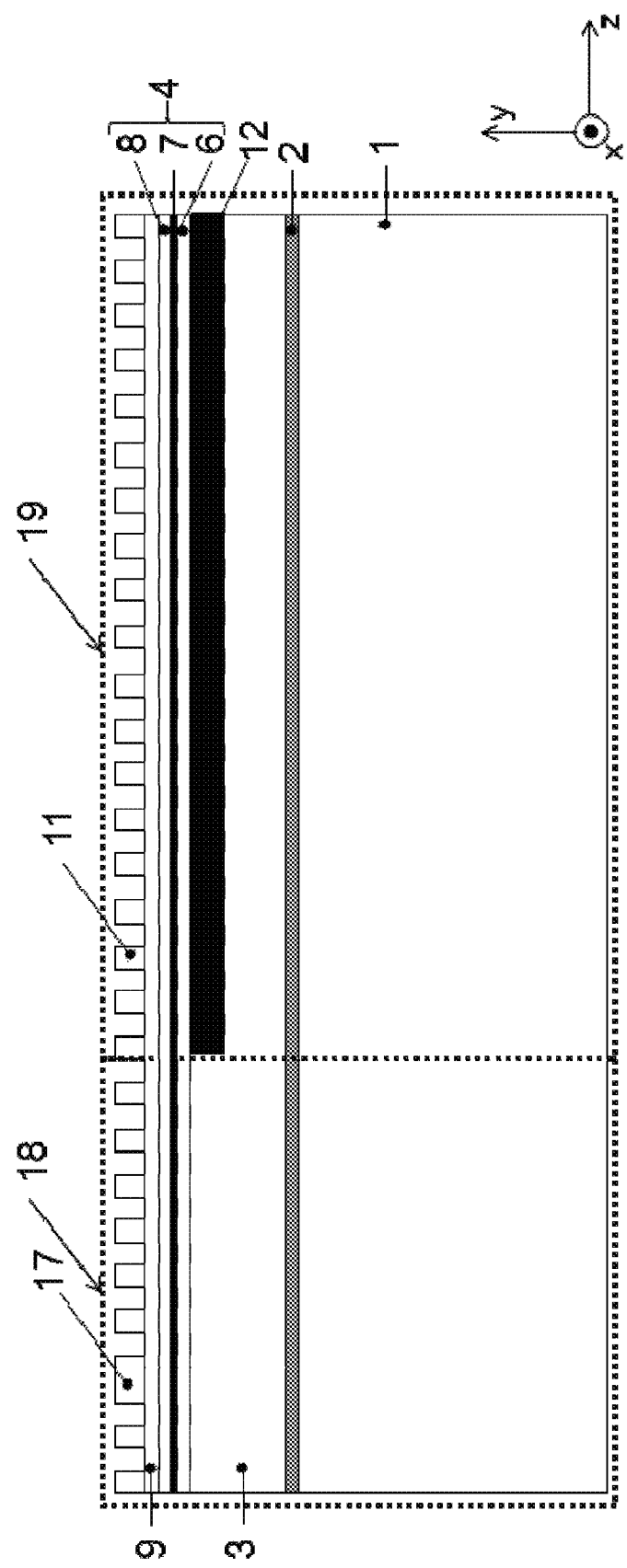
FIG. 3 is a longitudinal section view of a laser as described in the disclosure.

FIG. 3 is a schematic diagram showing the longitudinal structure (zy plane) of the laser. The surface of the ridge waveguide is provided with two sets of first-order Bragg gratings 18 and 19 having the same etching depth $H_g$ and the period $\wedge = \lambda_B/2n_{eff}$, where $\lambda_B$ and $n_{eff}$ are the Bragg wavelength of the grating and the effective refractive index of the waveguide, respectively. Therefore, the Bragg gratings have the same coupling coefficient and can provide maximum reflection at the Bragg wavelength. The $\lambda/4$ phase shift region 17 is inserted in the first-order Bragg grating 18 to ensure that the laser can operate stably at the Bragg wavelength $\lambda_B$, which is at the center of the Bragg stopband. That is, there is a mode of lowest loss at the Bragg wavelength, thereby achieving single mode operation at a stable wavelength, that is, at a Bragg wavelength. The electrodes are disposed on both sides of the ridge waveguide corresponding to the grating 18, and the ridge waveguide of the grating 19 has no electrodes on its two sides. In the second cladding layer of the ridge waveguide in which the grating is located, ions are implanted into the region close to the active layer to form a high resistance region for limiting holes injection, and the path of the current can be effectively controlled by adjusting the position of the ion implantation region. The corresponding high resistance regions of the grating 18 are located on two sides of the ridge waveguide such that holes are injected from directly under the ridge waveguide into the active layer region. However, the high resistance region corresponding to the grating 19 extends to the entire layer, resulting in no current injection and no gain can be obtained. Therefore, the grating acts as a reflection region mainly for the optical feedback of the laser to lower the threshold and ensure single mode operation of the laser. The end of the grating 19 as the reflection region is the output end of the laser. To reduce the reflection of cleaved facet, a small-angle curved waveguide or a horizontally inclined end-face or the like is used for avoiding reflection from the end-face. The output end of the laser is coated with an anti-reflection film, and the reflectance of the anti-reflection film is less than 1%.

Figure 4:
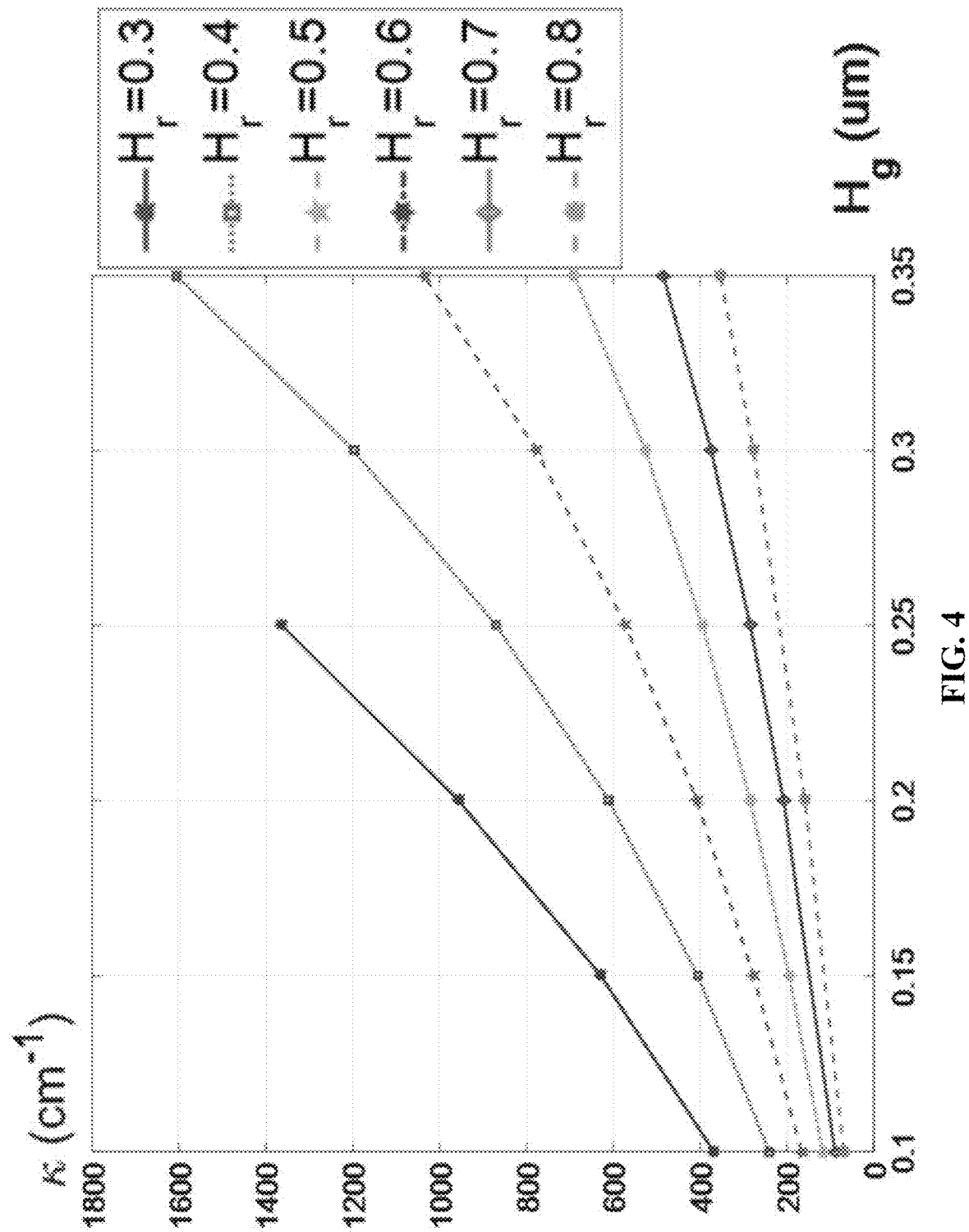
FIG. 4 shows the relationship between the height of a ridge waveguide, the etching depth of gratings, and the coupling coefficient of the gratings of a laser as described in the disclosure.

The height $H_r$ of the ridge region and the etching depth $H_g$ of the grating can be determined according to the characteristics of the laser. A high refractive index material having a ridge thickness as thin as less than 1 micrometer is selected to form the ridge region because the first order Bragg grating cannot be etched too deeply. The mode of the ridge waveguide has a relatively large optical confinement factor in the ridge, and the optical field of the ridge region forms a strong interaction with the grating. The grating therefore has a large coupling coefficient. As shown in FIG. 4, the height $H_r$ of the ridge region and the etching depth $H_g$ ($H_r > H_g$) of the grating are closely related to the coupling coefficient of the grating. The thinner the height $H_r$ of the ridge, the deeper the etching depth $H_g$ of the grating, and the larger the coupling coefficient of the grating. Generally, the coupling coefficient of the grating in the buried grating structure in the prior art is less than 250 cm$^{-1}$, and the coupling coefficient in the disclosure can reach 1000 cm$^{-1}$ or more. As shown in FIG. 4, the thickness of the ridge region is less than 0.5 microns.

Figure 5A:
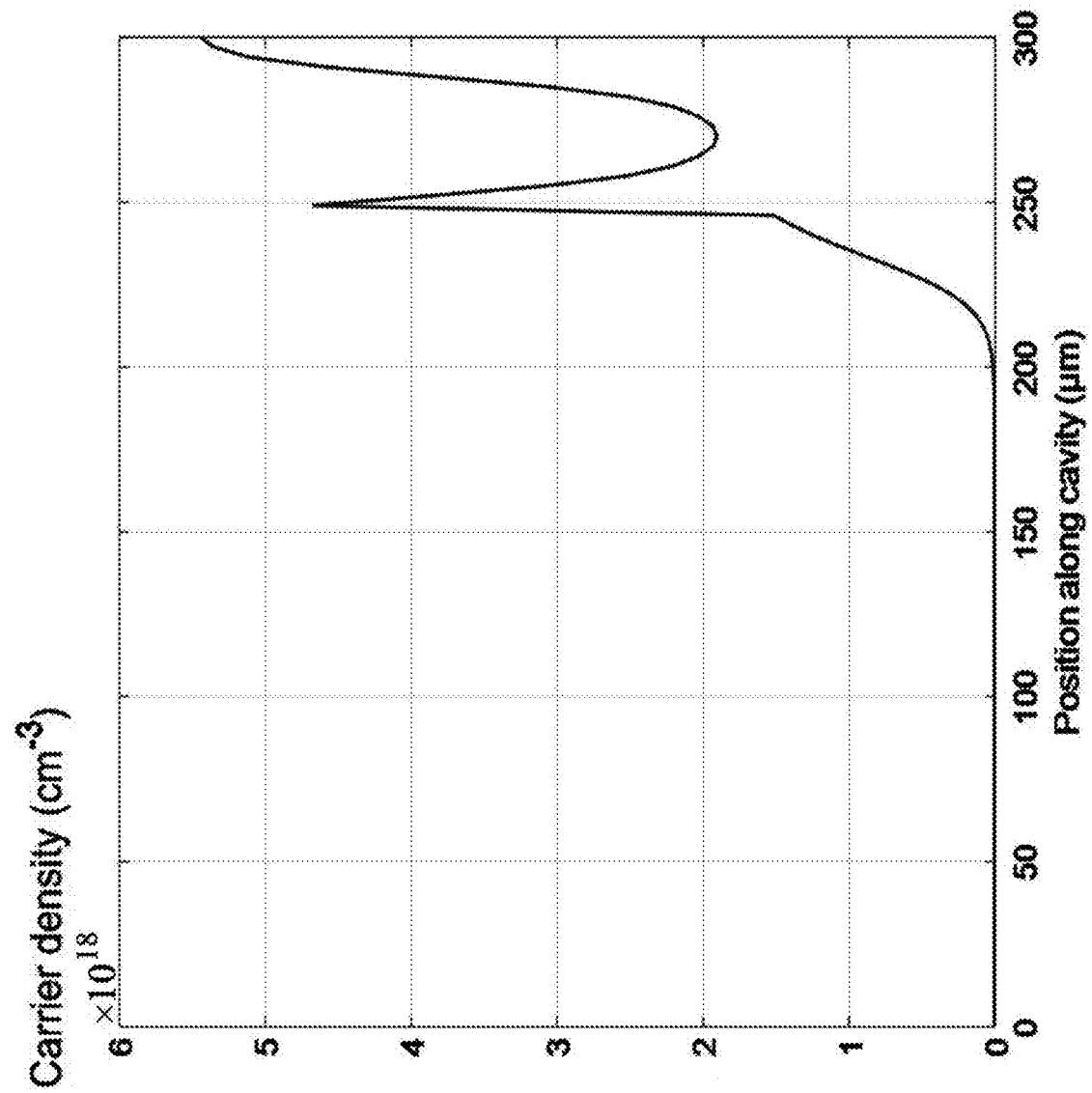
FIG. 5A shows the density distribution of carriers along the cavity of a laser as described in the disclosure.
Figure 5B:
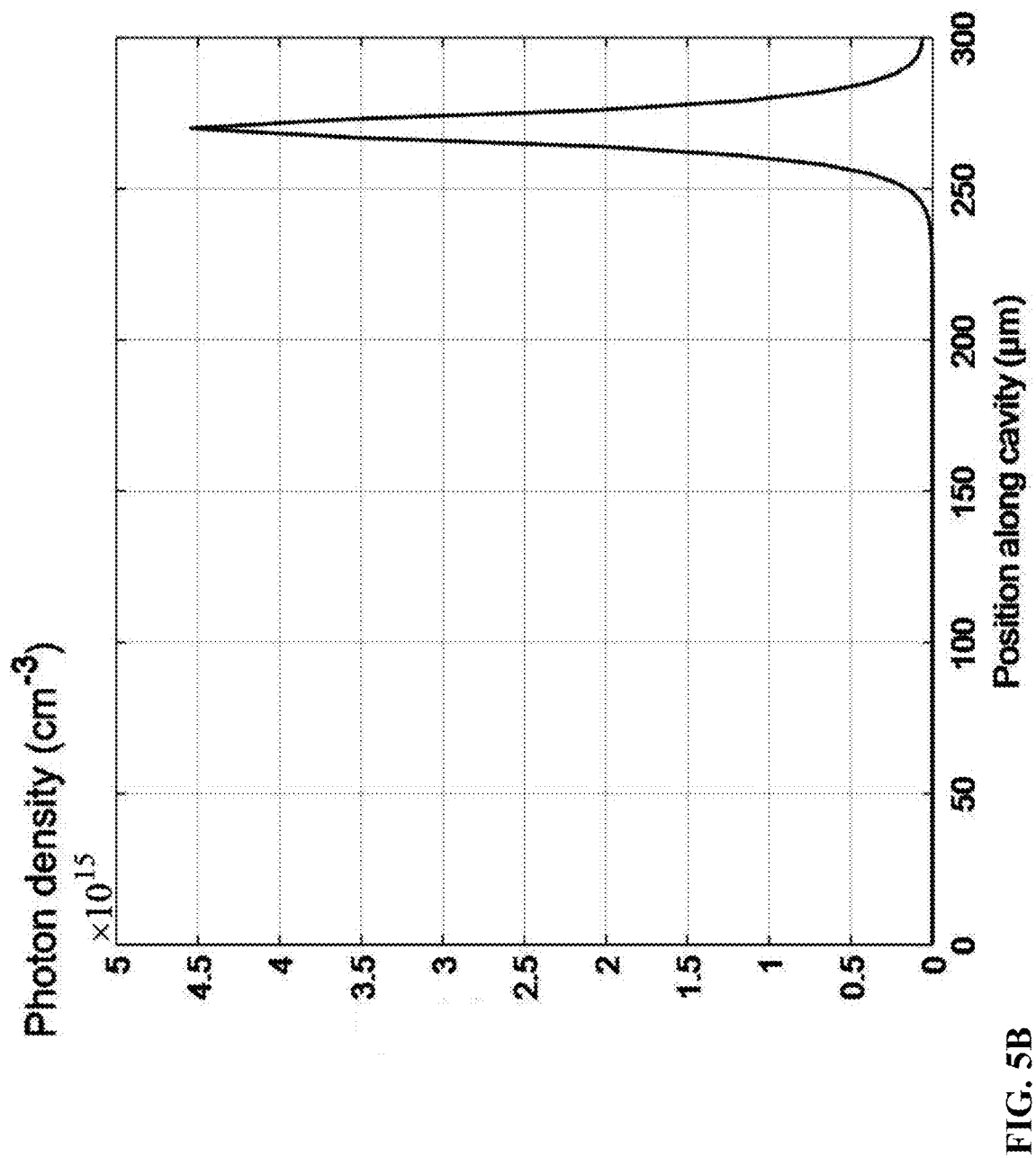
FIG. 5B shows the density distribution of photons along the cavity of a laser as described in the disclosure.
Figure 6:
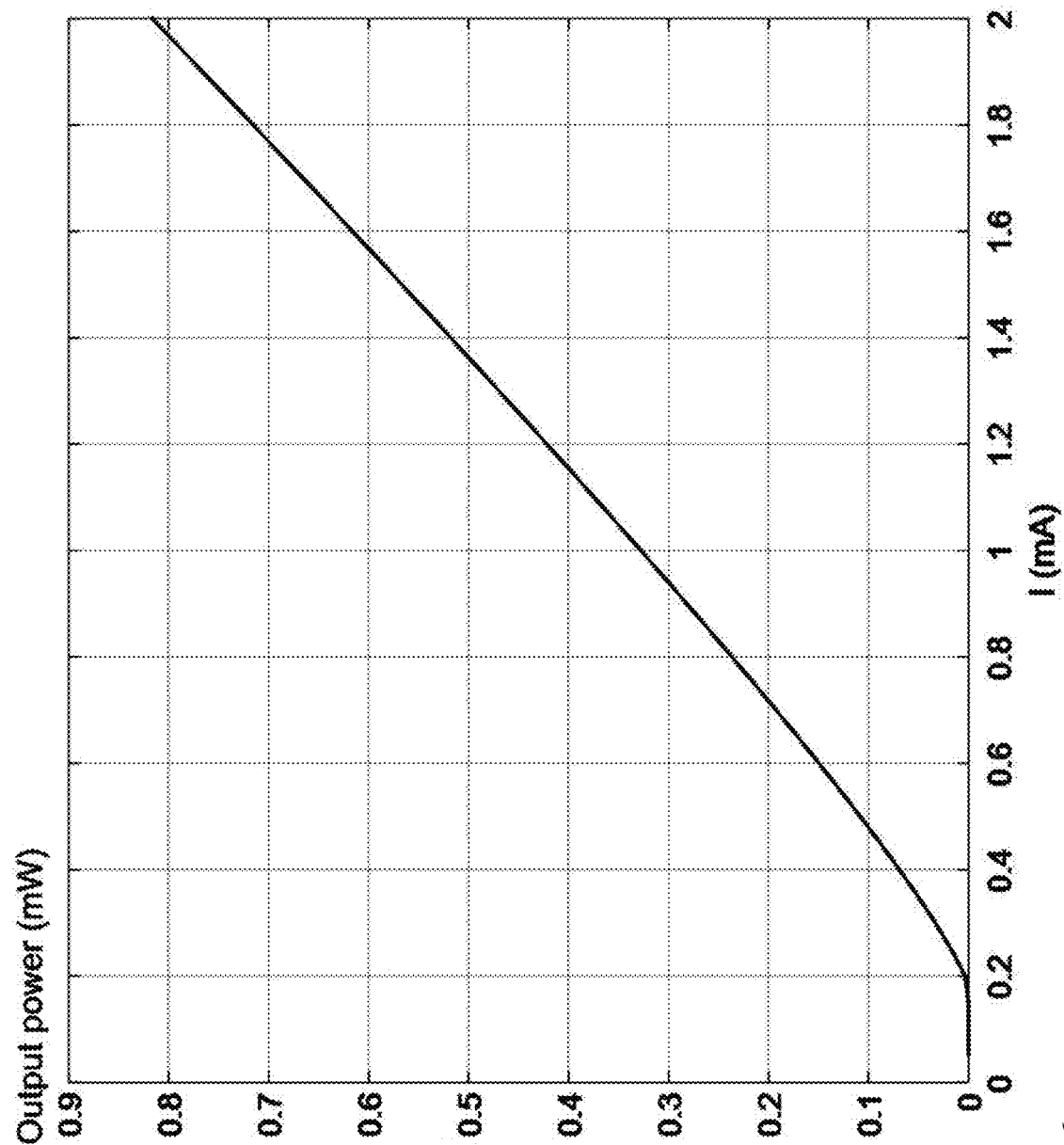
FIG. 6 shows the relationship between the output optical power and the input current of a laser as described in the disclosure.

FIG. 5A and FIG. 5B show the density distributions of carriers and photons along the cavity of the laser in the case of injecting a current of 2 mA, respectively. The results show that their distributions in the grating 16 and the reflection region of grating 15 are not uniform along the laser cavity. FIG. 6 shows the relationship between the output power and the input current of the laser. It can be seen that the threshold current is as low as only about 0.2 mA, and the slope efficiency reaches 0.5 mW/mA, indicating that the laser achieves a low threshold and a high slope efficiency at short cavity lengths.

It will be obvious to those skilled in the art that changes and modifications may be made, and therefore, the aim in the appended claims is to cover all such changes and modifications.

What is claimed is:

1. A distributed feedback laser, comprising:
   a ridge waveguide;
   two upper electrodes disposed on both sides of the ridge waveguide, respectively;
   two lower electrodes disposed on two sides of the upper electrodes, respectively;
   a substrate;
   a second cladding layer;
   an active layer; and
   a first cladding layer; wherein:
   the first cladding layer is n-doped and comprises a conductive layer and a refractive layer disposed on the conductive layer; a refractive index of the refractive layer is greater than that of the active layer; the refractive layer has a thickness of less than 1 micrometer;
   a ridge region of the ridge waveguide is formed in an intermediate portion of the refractive layer, and a Bragg grating is etched on the surface of the ridge region;
   two grooves are formed between the ridge waveguide and the upper electrodes; the conductive layer is connected to the upper electrodes;
   the second cladding layer comprises one or more current limited regions, or a buried tunnel junction is formed in the first cladding layer for restricting current; and
   the second cladding layer comprises an ohmic contact layer which is connected to the two lower electrodes.

2. The laser of claim 1, wherein a light field of the ridge region forms an interaction with the Bragg grating, and a coupling coefficient of the Bragg grating is greater than 250 cm$^{-1}$.

3. The laser of claim 1, wherein the Bragg grating is a first-order grating comprising one or more phase shift regions of $\lambda_B/4$, or the Bragg grating is a high-order grating; a period of the Bragg grating is $\wedge = \lambda_B/2n_{eff}$, where $\lambda_B$ and m are a Bragg wavelength and an order of the Bragg grating, respectively, and $n_{eff}$ is an effective refractive index of the ridge waveguide.

4. The laser of claim 1, wherein the conductive layer is n-doped.

5. The laser of claim 1, wherein the two grooves extend to the conductive layer, and a width of the two grooves is greater than 500 nanometers.

6. The laser of claim 1, wherein the upper electrode is N-type electrode, and the lower electrode is P-type electrode.

7. The laser of claim 2, wherein the active layer is not doped, and comprises one or more confinement layers, and one layer consisting of multi-quantum wells, quantum wires, quantum dots, or bulk material.

8. The laser of claim 1, wherein the second cladding layer is p-doped; the first cladding layer, the active layer, and the second cladding layer form an N-i-P structure; the one or more current limited regions are formed at a position near the active layer in the second cladding layer to limit the injection of holes, so that the hole injection region and the ridge waveguide mode are maximally overlapped.

9. The laser of claim 1, wherein a method for forming the one or more current limited regions comprises: forming by ion implantation into a corresponding region; or forming an aluminum-rich layer in a corresponding region, and then oxidizing the aluminum-rich layer from both sides to form aluminum oxide, thereby forming a high resistance region; or a tunnel junction is used above the active layer region to limit the injection of holes.

10. The laser of claim 1, wherein the ohmic contact layer is p-doped and has a doping density ranging from $10^{19}$ to $10^6$ cm$^{-3}$.

* * * * *